United States Patent
Allen

[19]

[11] Patent Number: 5,910,735
[45] Date of Patent: Jun. 8, 1999

[54] METHOD AND APPARATUS FOR SAFE MODE IN DYNAMIC LOGIC USING DRAM CELL

[75] Inventor: David H. Allen, Rochester, Minn.

[73] Assignee: International Business Machines Corporation, Armonk, N.Y.

[21] Appl. No.: 08/861,586

[22] Filed: May 22, 1997

[51] Int. Cl.$^6$ ................................................ H03K 19/096
[52] U.S. Cl. .................. 326/93; 326/95; 326/98
[58] Field of Search ................... 326/93, 95, 98, 326/112, 119, 121, 22, 23, 24, 26, 27, 17; 327/215, 219, 225

[56] References Cited

U.S. PATENT DOCUMENTS

| | | | |
|---|---|---|---|
| 4,694,205 | 9/1987 | Shu et al. | 365/203 |
| 5,065,048 | 11/1991 | Asai et al. | 326/98 |
| 5,831,451 | 11/1998 | Bosshart | 326/93 |

*Primary Examiner*—Michael Tokar
*Assistant Examiner*—Qui Van Duong
*Attorney, Agent, or Firm*—Jack V. Musgrove; Andrew J. Dillon

[57] ABSTRACT

A dynamic logic circuit operates in a normal mode, and in a safe mode for which the circuit is less susceptible to noise than with the normal mode. The dynamic logic circuit includes a logic network having at least one input, a precharge device having a storage node connected to the logic network, and a device for varying a capacitance of the storage node to provide the normal and safe modes of operation. In one embodiment, the capacitance at the storage node is varied by selectively connecting the storage node to a capacitor, particularly to a DRAM cell capacitor. The DRAM cell is advantageously fabricated on a chip in close proximity to the storage node. A logic process using a plurality of such dynamic logic circuits can have means for independently operating each of the circuits in the safe mode, and the circuits can be monitored during the normal and safe operation modes to determine whether any are failing during the normal operation mode, e.g., due to excess noise.

19 Claims, 4 Drawing Sheets

METHOD AND APPARATUS FOR SAFE MODE IN DYNAMIC LOGIC USING DRAM CELL

BACKGROUND OF THE INVENTION

1. Field of the Invention

The present invention generally relates to electronic logic circuits, and more particularly to a method of providing a safe operating mode for dynamic logic circuits, making them less susceptible to failures caused by noise.

2. Description of the Related Art

Modern digital electronic devices use a variety of logic circuits to accomplish various tasks. For example, microprocessors have execution units that are composed of a multitude of such logic circuits as AND, OR, NAND, NOR, XOR, and NOT gates. These logic circuits operate on input binary values to produce output binary values, i.e., a given value (signal) is either in a "low" voltage state (a value of zero) or a "high" voltage state (a value of one). The exact voltage of a high or low signal may vary considerably, and circuits are designed to be tolerant of margins about a nominal value. For example, conventional transistor-transistor-logic (TTL) logic levels use a voltage threshold of 1.4 volts, with a margin of 0.6 volts about the threshold, i.e., a high voltage state can be as low as 2.0 volts, and a low voltage state can be as high as 0.8 volts. Conventional circuitry using complementary metal-oxide semiconducting (CMOS) technology typically provides a voltage threshold between 2.0 and 3.0 volts.

There are generally two types of logic circuits, static and dynamic. Static circuits are typically constructed with elements that indefinitely remain in a given binary state (1 or 0) until the information in the element is intentionally changed, or the power to the circuit is shut off, so static circuitry does not need to be precharged. Dynamic circuits, in contrast, store information in capacitors, which can hold data for only a few milliseconds, so dynamic circuits must be regularly precharged using external circuitry.

A generic dynamic logic circuit is shown in FIG. 1. Dynamic logic circuit 10 includes a precharge device in the form of a p-type field-effect transistor (PFET) 12. The gate of PFET 12 is connected to the clock signal, its source is connected to the power supply ($V_{dd}$), and its drain is connected to the logic network 14. A feedback or half-latch device in the form of another PFET 16 is connected in parallel with transistor 12, i.e., the source of transistor 16 is connected to $V_{dd}$ and its drain is also connected to logic network 14. The precharge node (the drains of transistors 12 and 16) is provided as an input to an inverter 18 whose output provides the output of the circuit, and which is connected to the gate of transistor 16. Logic network 14 is connected to ground via an evaluate device in the form of an n-type field-effect transistor (NFET) 18, whose gate is connected to the clock signal. The details of logic network 14 depend upon the type of logic circuit to be provided. For example, in a 2-input AND gate, the logic network consists of two serially connected NFETs, whose gates are respectively connected to the two inputs. Dynamic logic offers significant advantages over static logic, particularly in performance (speed) and required area. It is accordingly desirable to use dynamic logic to implement as much of the logical function as possible in a very large scale integrated (VLSI) chip design.

Logic circuits can generate erroneous signals, i.e., where the voltage level shifts beyond a threshold value, due to various reasons, such as a defective component (transistor, resistor, etc.), leakage, or noise. Dynamic logic is particularly sensitive to electrical noise. Inputs to dynamic logic circuits can effectively turn "on" due to noise and cause the logic to evaluate improperly. Usually, a charge is stored during a precharge phase of operation and then conditionally discharged during an evaluation phase of operation. However, this stored charge can be accidentally degraded or destroyed due to a variety of leakage or noise mechanisms, including capacitive coupling to adjacent signals, charge sharing, subthreshold conduction through the logic transistors, and conduction through the logic transistors due to noise on the inputs. If enough of the charge stored on the dynamic node is lost due to one or more of these mechanisms, the output of the dynamic logic gate with transition to the opposite state of the correct value. This error can propagate and cause a complete failure of the design.

Failures in the field are clearly undesirable, but failures during development of a device (such as a processor) can also be very difficult to isolate and identify, often extending development cycles and prolonging product introduction. Noise problems in general are difficult to detect because of their dependency on environmental conditions, processing variations, and data, and this difficulty applies as well to noise problems which cause dynamic circuits to fail. Unlike a straightforward long-path performance failure or an AC defect failure, noise problems cannot be made to disappear simply by extending cycle time.

In light of the foregoing, it would be desirable to provide a method of remedying noise problems in dynamic circuits, particularly to allow hardware and software development to progress until a more permanent (high-performance) solution to the noise problem can be designed and implemented. It would be further advantageous if the dynamic circuits could be made to selectively operate in a safe mode to facilitate detection of a noise problem, but the circuitry required for the safe mode should not have an impact so adverse as to negate the advantages of dynamic circuits over static circuits.

SUMMARY OF THE INVENTION

It is therefore one object of the present invention to provide an improved logic circuit.

It is another object of the present invention to provide an improved dynamic logic circuit which can be selectively rendered less susceptible to noise problems.

It is yet another object of the present invention to provide such a dynamic logic circuit which can be implemented in a relatively small area compared to other structures available in conventional CMOS processes.

The foregoing objects are achieved in a dynamic logic circuit generally comprising a logic network having at least one input, a precharge device having a storage node connected to the logic network, and means for varying a capacitance of the storage node to provide a normal mode of operation of the dynamic logic circuit, and a safe mode of operation of the dynamic logic circuit for which the circuit is less susceptible to noise than with the normal mode of operation. In one embodiment, the capacitance varying means includes means for selectively connecting said storage node to a capacitor, particularly to a DRAM cell capacitor. The DRAM cell is advantageously fabricated on a chip in close proximity to the storage node. The connection may be provided by a pass transistor, including an n-type field-effect transistor (NFET) or a p-type field-effect transistor (PFET). The logic network can use similar devices, and the pass transistor preferably has an effective conductance to ground that is approximately equal to that of the logic network devices. A logic process using a plurality of such dynamic logic circuits can have means for independently operating each of the circuits in the safe mode, and the circuits can be monitored during the normal and safe operation modes to determine whether any are failing during the normal operation mode, e.g., due to excess noise. The use of DRAM cells allows a very high capacitance per area when compared to other structures available in conventional CMOS chips, so the circuitry required for the safe mode substantially retains the advantages provided by the dynamic nature of circuit.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein:

DESCRIPTION OF THE PREFERRED EMBODIMENT

Figure 2:
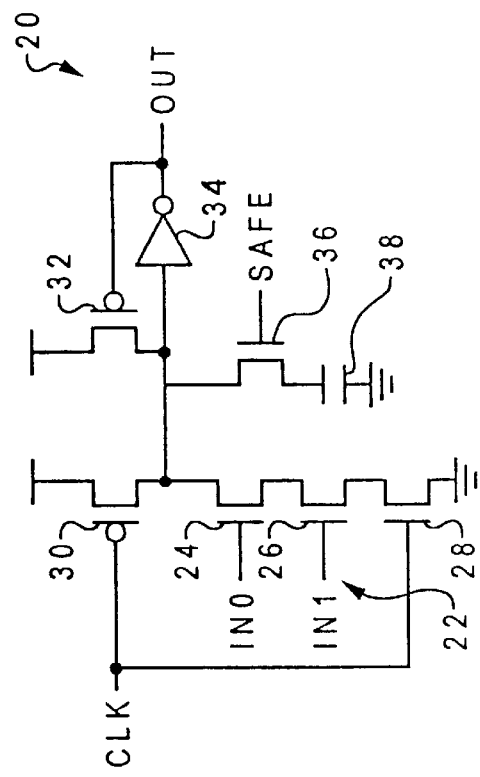
FIG. 2 is a schematic diagram of a dynamic 2-input AND gate constructed in accordance with the present invention.
Figure 1:
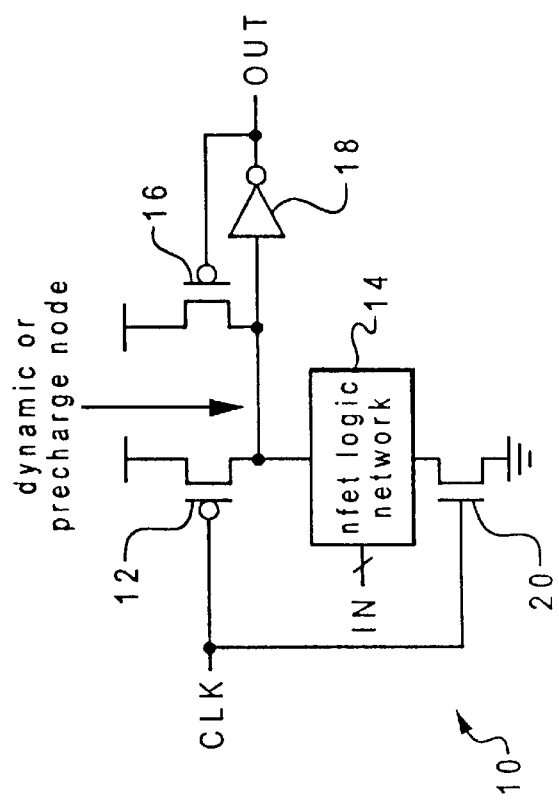
FIG. 1 is schematic diagram of a conventional, generalized dynamic logic circuit.

With reference now to the figures, and in particular with reference to FIG. 2, there is depicted one embodiment of a dynamic logic circuit 20 constructed in accordance with the present invention. Dynamic logic circuit 20 is, in this embodiment, a 2-input AND gate, having a logic network 22 which includes two serially connected n-type field-effect transistors (NFETs) 24 and 26, the drain of NFET 24 being connected to the source of NFET 26, and the two inputs being respectively connected to the gates of NFETs 24 and 26. The drain of NFET 26 is connected to an evaluate device in the form of an NFET 28, whose drain is connected to ground, and whose gate is connected to the clock signal. The clock signal also drives a precharge device in the form of a p-type field-effect transistor (PFET) 30, whose source is connected to the power supply ($V_{dd}$), and whose drain is connected to the source of NFET 24. A feedback or half-latch device in the form of another PFET 32 is connected in parallel with PFET 30, i.e., the source of PFET 32 is connected to $V_{dd}$ and its drain is also connected to logic network 22. The precharge node (the drains of PFETs 30 and 32) is provided as an input to an inverter 34 whose output provides the output of dynamic logic circuit 20, and which is connected to the gate of PFET 32.

The effects of excessive noise on dynamic logic circuit 20 can be mitigated by operating the circuit in a "safe" mode, using a switching or pass transistor 36 whose source is connected to the precharge (storage) node and whose drain is connected to a capacitor 38, such that the capacitance on the precharge node may be selectively varied. Capacitor 38 can be a dynamic random access memory (DRAM) cell, so the invention can take advantage of chip designs having merged DRAM/logic processes. DRAM cells offer a very high capacitance per area when compared to other structures available in conventional CMOS chips. Therefore, the circuitry used for the safe mode does not negate the advantages provided by the dynamic nature of circuit 20.

The DRAM cell can be fabricated in close proximity to the dynamic logic gate (in particular, close to the dynamic node) and electrically connected to the dynamic node of the circuit through a pass transistor that can be either an NFET or PFET, depending upon the DRAM process; in this depiction, it is an NFET. When the SAFE signal on the gate of pass transistor 36 is low (safe mode disabled), the pass transistor is off and the DRAM cell capacitance is isolated from the dynamic node of the gate; in this normal operation, the circuit switches relatively fast. When the SAFE signal is high (safe mode enabled), NFET 36 is turned on, and a conducting channel exists between the dynamic node of circuit 20 and the ungrounded plate of the DRAM capacitor, increasing the overall capacitance of the dynamic node, causing it to evaluate more slowly, and hence requiring a longer cycle time in safe mode. Since running in safe mode assumes the circuit is being, e.g., debugged in a diagnostic or self-test environment, a longer cycle time is acceptable.

The higher capacitance on the storage node "hardens" the dynamic circuit to noise and can restore a circuit that was previously failing due to noise. The same capacitance which takes more time to intentionally discharge (during evaluation) also requires a greater intrusion of unintentional charge transfer to cause a failure, making it much less likely that any noise mechanism will corrupt the state of the logic gate. Thus, dynamic logic circuit 20 facilitates detection of a noise problem in a logic process having many logic circuits, i.e., the safe mode can be logically controlled (each circuit independently) so that the existence of a noise problem is deduced by monitoring and observing a failure with the safe mode disabled and observing the absence of any failure with the safe mode enabled. This ability allows isolation of the problem so that the design can be modified to correct the noise problem, while allowing at least partial verification of the hardware, albeit at a slower cycle time.

Pass transistor 36 adds a small amount of capacitance to the dynamic node even when it is off due to the drain diffusion capacitance of the pass transistor. This small capacitance can degrade performance of the dynamic logic circuit slightly, but if sized properly a dynamic gate using this solution will still be significantly faster than a static implementation. Similarly, the area required to implement the pass device is small if sized properly. An optimal sizing for the pass gate would be on the order of a transistor with approximately the same effective conductance to ground that is found in NFET logic network 22. The DRAM cell capacitor adds a very small amount of area to the dynamic gate physical design.

Figure 3:
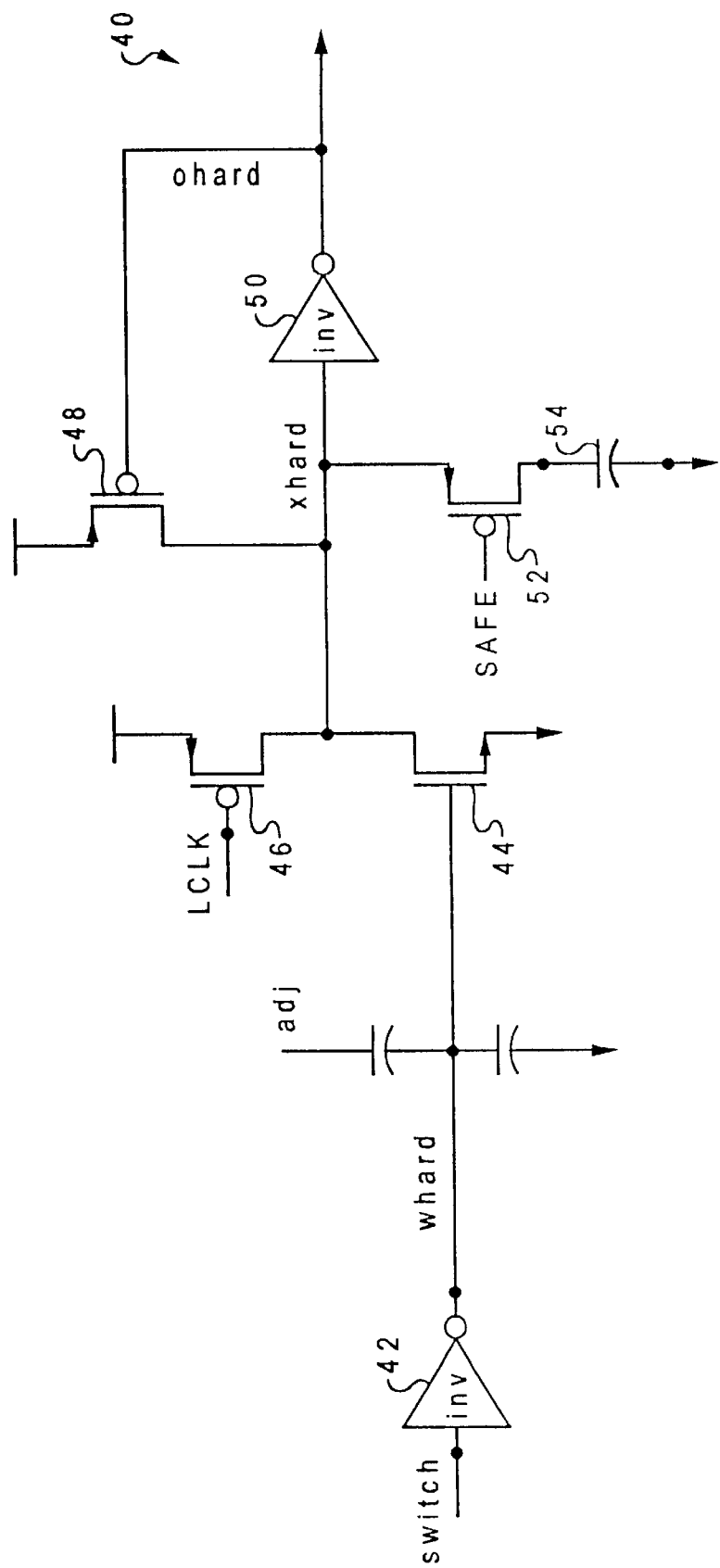
FIG. 3 is a schematic diagram of a dynamic buffer constructed in accordance with the present invention.

With further reference to FIG. 3, the present invention can be applied to other types of dynamic circuits, including a dynamic logic gate (buffer) 40. Buffer 40 includes an inverter 42 whose output is connected to the gate of an NFET 44. The drain of NFET 44 is connected to ground, and its source is connected to a precharge node formed with two parallel PFETs 46 and 48. The gate of PFET 46 is connected to the clock, and the gate of PFET 48 is connected to the output of an inverter 50 whose input is connected to the precharge node, and which provides an output of circuit 40. A PFET 52 is used as a pass transistor to connect the precharge node to a DRAM cell capacitor 54. For safe mode simulation, the gate of pass transistor 52 is tied to ground, although it can be selectively controlled by the safe mode control signal.

Figure 4A:
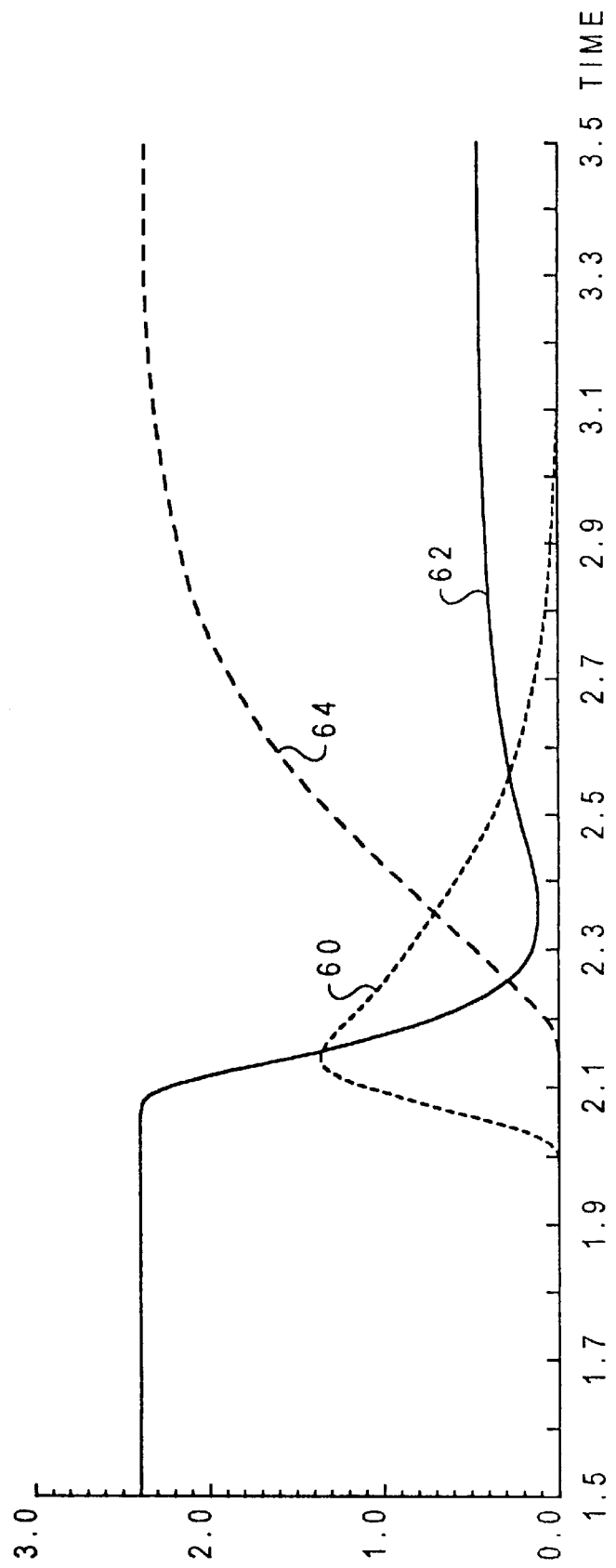
FIGS. 4A and 4B are signals traces of various nodes in the circuit of FIG. 3, for two different operating modes (normal and safe).
Figure 4B:
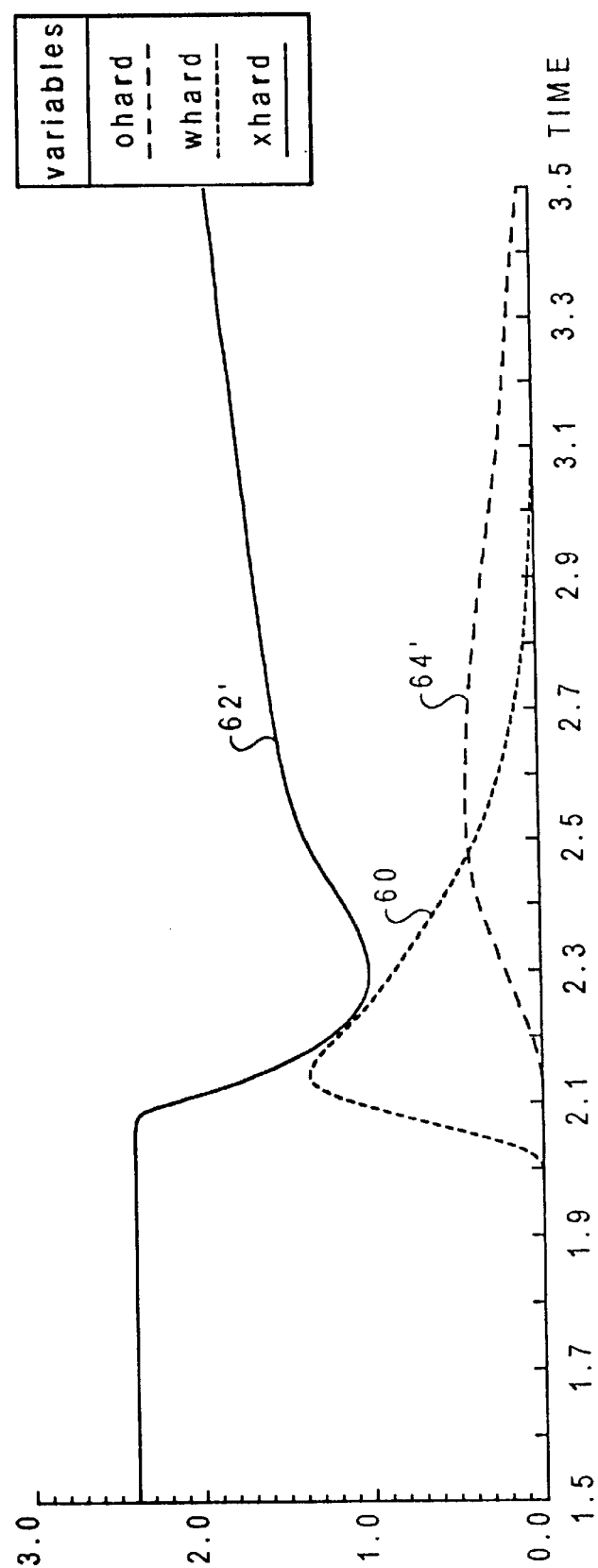

FIGS. 4A and 4B illustrates the output of a circuit simulation showing operation of the dynamic logic circuit of FIG. 3. In these figures, the input of inverter 42 was held at a static high level so the output of inverter 42 is at a static low level and node "adj" was switched from a low level to a high level. This change caused node "whard" to couple above ground through the capacitive divider networks, here representing coupling between adjacent metal wires (a common source of noise). In FIG. 4A, the pass transistor (transistor 52 of FIG. 3) is not conducting, i.e., the safe mode control signal (SAFE*) is in a high voltage state. Signal 60 ("whard") is the input to the dynamic logic gate and is seen to exhibit a large noise spike. This noise spike causes a transistor in the logic network (transistor 44 of FIG. 3) to temporarily conduct charge from the dynamic node "xhard" to ground (signal 62), further causing the output of inverter 50 (signal 64) to rise in response to the falling precharge node. Although a feedback device is provided in this design, it cannot defeat the effect of the noise spike and in fact turns mostly off as a result of the inverter switching, so the circuit fails due to the noise.

In FIG. 4B, the pass transistor 52 is conducting (SAFE* is low, safe mode enabled), and the same noise spike is applied via signal 60. While the dynamic node "xhard" (signal 62') drops as a result of the noise, it does not fall as far toward ground as did the prior signal 62, due to the existence of the increased capacitance from the DRAM cell represented in FIG. 3 by capacitor 54. In this case, the output of inverter 50 (signal 64') rises but not enough to turn off the feedback device, which continues to conduct and restore (albeit slowly) the dynamic node "xhard" to a high level, so the circuit does not fail in spite of the noise. A simulation of the operation of circuit 40 as compared to a prior art circuit not having the selectable DRAM cell capacitor revealed that a performance loss associated with the capacitance of the pass transistor was only about 5% of the delay through the dynamic gate.

Multiple levels of capacitance can be provided for even more complicated testing for noise effects. Multiple DRAM cell capacitors can be connected in parallel, in varying numbers, to provide different increases of capacitance to the dynamic node. In addition, the use of the switch capacitor is not limited to the precharge node controlling the output; it may also be used to selectively add capacitance to intermediate nodes, for example, nodes between the NFETs in a logic network to selectively control charge sharing.

Although the invention has been described with reference to specific embodiments, this description is not meant to be construed in a limiting sense. Various modifications of the disclosed embodiment, as well as alternative embodiments of the invention, will become apparent to persons skilled in the art upon reference to the description of the invention. It is therefore contemplated that such modifications can be made without departing from the spirit or scope of the present invention as defined in the appended claims.

I claim:

1. A dynamic logic circuit comprising:
   a logic network having at least one input;
   a precharge device having a storage node connected to said logic network; and
   means for varying a capacitance of said storage node to provide a normal mode of operation of the dynamic logic circuit, and a safe mode of operation of the dynamic logic circuit for which the circuit is less susceptible to noise than with said normal mode of operation.

2. The dynamic logic circuit of claim 1 wherein said capacitance varying means includes means for selectively connecting said storage node to a capacitor.

3. The dynamic logic circuit of claim 2 wherein said connecting means includes an n-type field-effect transistor.

4. The dynamic logic circuit of claim 2 wherein said connecting means includes a p-type field-effect transistor.

5. The dynamic logic circuit of claim 2 wherein said capacitor is a dynamic random access memory (DRAM) cell.

6. The dynamic logic circuit of claim 5 wherein said DRAM cell is fabricated on a chip in close proximity to said storage node.

7. The dynamic logic circuit of claim 2 wherein:
   said logic network includes at least one n-type field-effect transistor (NFET); and
   said connecting means includes a transistor having an effective conductance to ground that is approximately equal to that of said NFET.

8. A logic process using a plurality of the dynamic logic circuits of claim 7, and further comprising means for independently operating each of the circuits in said safe mode.

9. The dynamic logic circuit of claim 1 wherein said logic network includes a plurality of n-type field-effect transistors.

10. A logic process using a plurality of the dynamic logic circuits of claim 1, and further comprising means for independently operating each of the circuits in said safe mode.

11. The dynamic logic circuit of claim 1 wherein the dynamic logic circuit is used by a processor having a system clock, and said precharge device is driven by a signal from said system clock.

12. A method of controlling a logic process having at least one dynamic logic circuit including a logic network and a precharge device having a storage node connected to the logic network, the method comprising the steps of:
   operating the dynamic logic circuit in a normal mode of operation wherein the storage node has a first capacitance; and
   operating the dynamic logic circuit in a safe mode of operation wherein the storage node has a second capacitance larger than the first capacitance, to render the dynamic logic circuit less susceptible to noise than with the normal mode of operation.

13. The method of claim 12 comprising the further step of providing means for varying the capacitance of the storage node by selectively connecting the storage node to a capacitor.

14. The method of claim 13 wherein:
   the storage node is connected to the capacitor with an n-type field-effect transistor (NFET);
   said step of operating the dynamic logic circuit in the normal mode includes the step of applying a low voltage signal to a gate of the NFET to render the NFET nonconducting; and
   said step of operating the dynamic logic circuit in the safe mode includes the step of applying a high voltage signal to a gate of the NFET to render the NFET conducting and thereby connect the storage node to the capacitor.

15. The method of claim 13 wherein:
   the storage node is connected to the capacitor with a p-type field-effect transistor (PFET);

said step of operating the dynamic logic circuit in the normal mode includes the step of applying a high voltage signal to a gate of the PFET to render the PFET nonconducting; and said step of operating the dynamic logic circuit in the safe mode includes the step of applying a low voltage signal to a gate of the PFET to render the PFET conducting and thereby connect the storage node to the capacitor.

16. The method of claim 13 wherein said step of providing the capacitance varying means includes the step of fabricating a dynamic random access memory (DRAM) cell on a chip containing the dynamic logic circuit, the DRAM cell being used as the capacitor.

17. The method of claim 16 wherein said fabricating step places the DRAM cell on the chip in close proximity to the storage node.

18. The method of claim 12 wherein the logic process has a plurality of such dynamic logic circuits, and comprising the further step of operating the dynamic logic circuits in the safe mode independently of each other.

19. The method of claim 12 comprising the further step of monitoring the operation of the dynamic logic circuit during the normal and safe operation modes to determine whether the dynamic logic circuit has failed during the normal operation mode.

\* \* \* \* \*